(12) United States Patent
Chuang et al.

(10) Patent No.: US 6,774,059 B1
(45) Date of Patent: Aug. 10, 2004

(54) HIGH CRACK RESISTANCE NITRIDE PROCESS

(75) Inventors: Poyo Chuang, Tainan (TW); Chyi-Tsong Ni, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/417,320

(22) Filed: Apr. 16, 2003

(51) Int. Cl.$^7$ .............................................. H01L 21/31
(52) U.S. Cl. .................. 438/791; 438/624; 438/422; 438/619; 438/652; 438/775; 438/763; 438/757; 438/761; 438/744; 438/724; 257/760; 257/750; 257/644; 257/758; 148/217; 427/249.15
(58) Field of Search ............................ 438/624, 422, 438/619, 791, 652, 775, 763, 757, 761, 744, 724, 792, 786, 698, 758, 737, 954; 257/760, 750, 644, 758, 699, 178; 148/217, DIG. 114; 427/249.15

(56) References Cited

U.S. PATENT DOCUMENTS

| | | | |
|---|---|---|---|
| 4,824,697 A | 4/1989 | Ishihara et al. | 427/255.2 |
| 5,419,787 A | 5/1995 | Levi | 148/217 |
| 5,517,062 A | 5/1996 | Lur et al. | 257/760 |
| 5,665,632 A | 9/1997 | Lur et al. | 438/422 |
| 5,716,888 A | 2/1998 | Lur et al. | 438/619 |
| 5,877,095 A * | 3/1999 | Tamura et al. | 438/791 |
| 5,985,771 A * | 11/1999 | Moore et al. | 438/791 |
| 6,051,511 A * | 4/2000 | Thakur et al. | 438/791 |
| 6,136,688 A | 10/2000 | Lin et al. | 438/624 |
| 6,414,376 B1 * | 7/2002 | Thakur et al. | 257/640 |
| 6,420,777 B2 * | 7/2002 | Lam et al. | 257/640 |
| 6,461,985 B1 * | 10/2002 | Moore et al. | 438/791 |

OTHER PUBLICATIONS

TSMC Patent TW 307928, (NP–0687–TW).

* cited by examiner

Primary Examiner—Matthew Smith
Assistant Examiner—Belur Keshavan
(74) Attorney, Agent, or Firm—George O. Saile; Stephen B. Ackerman

(57) ABSTRACT

A new method of creating a relatively thick layer of PE silicon nitride. A conventional method of creating a layer of silicon nitride applies a one-step process for the creation thereof. Film stress increases as the thickness of the created layer of PE silicon nitride increases. A new method is provided for the creation of a crack-resistant layer of PE silicon nitride by providing a multi-step process. The main processing step comprises the creation of a relatively thick, compressive film of PE silicon nitride, over the surface of this relatively thick layer of PE silicon nitride is created a relatively thin (between about 150 and 500 Angstrom) layer of tensile stress PE silicon nitride. This process can be repeated to create a layer of PE silicon nitride of increasing thickness. A layer of PE silicon nitride can in this manner be created to a thickness of about 4 $\mu$m, whereby this thick layer of PE silicon nitride is free of stress and therefor free of therefrom following cracking of the layer of PE silicon nitride.

43 Claims, 2 Drawing Sheets

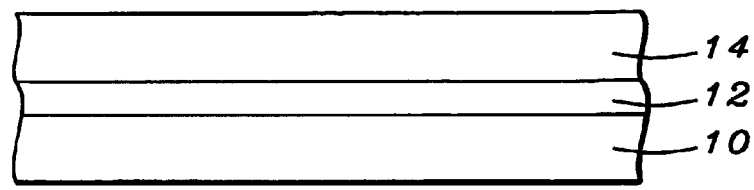
FIG. 1 - Prior Art
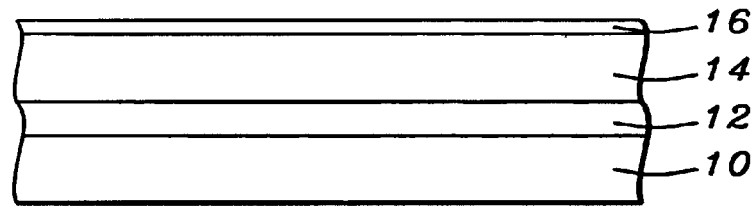
FIG. 2
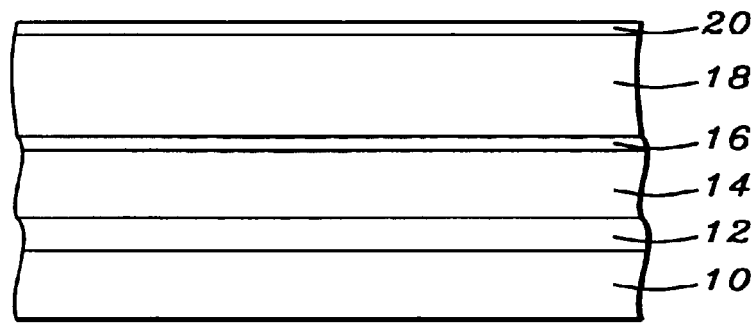
FIG. 3
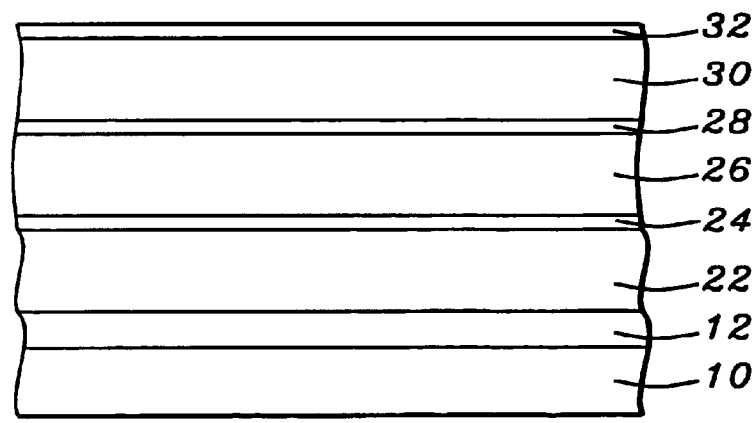
FIG. 4

HIGH CRACK RESISTANCE NITRIDE PROCESS

BACKGROUND OF THE INVENTION (1) Field of the Invention

The invention relates to the fabrication of integrated circuit devices, and more particularly, to a method creating a layer comprising nitride such that this layer does not present problems of layer cracking after layer creation.

(2) Description of the Prior Art

The creation of semiconductor devices requires the deposition and further processing of layers of semiconductor material that collectively form a functional semiconductor device or component. For desired operation of the deposited layers of semiconductor material, these layers must be created meeting specific design requirements such as good planarity of the surface of the deposited layers and uniform distribution or density of the deposited material. In addition these layers must, after the creation thereof, remain in a state and condition that has originally been obtained for the layer. Most specifically, deposited layers of semiconductor material must maintain their uniform distribution of deposition immediately after the layer has been created and further during the expected lifetime of the therewith created semiconductor device or component. For this reason it is a basic requirement of a created layer of semiconductor material that this layer is and remains stress free after its creation since the presence of stress in the layer readily leads to the occurrence of for instance cracks that may be internal to the created layer or that may appear over surface regions of the created layer.

A number of methods have been provided for the reduction of stress related problems encountered in created layers of semiconductor material. For instance, to reduce problems created by thermal stress, narrow trenches can be created which counteract the thermal stress within a created layer. Other methods have been provided that use composite materials for the creation of a layer of semiconductor material. Other methods create carefully controlled voids in for instance a layer of dielectric. Specially controlled methods of deposition, by for instance controlling in an advantageous manner, deposition temperature for the deposition of a layer of aluminum alloy have also been explored. Yet another method provides for capping a stress-prone layer with for instance a high compressive stress oxide.

These and other methods all have as common objective the creation of a layer of semiconductor material that meets design requirements of deposition and reliability. Some of these methods address layers of specific materials comprising for instance dielectric materials. The invention addresses concerns of stress-induced problems of layer creation where the created layer of semiconductor material comprises silicon nitride, concerns that become more acute for thick layers of silicon nitride.

In a conventionally created layer of Plasma Enhanced (PE) silicon nitride, the created film of silicon nitride typically shows relatively high intrinsic film stress. This problem becomes even more pronounced where a thick layer of PE silicon nitride is created and has been observed to be significantly present in layers of PE silicon nitride having a thickness of about 2 μm or in excess thereof. Such a thick layer of PE silicon nitride is basic to and used for the creation of a semiconductor device that is functional as a Finger Print Detector, whereby a (human) finger is directly brought into contact with the thick layer of PE silicon nitride for the identification of a Finger Print shown over the surface thereof. The need for a relatively thick layer of PE silicon nitride becomes apparent when it is considered that the human skin, thereby including surfaces of an exposed finger, are prone to secrete moisture and salt, which are both substances that can have a significantly detrimental effect on operational and reliability aspects of a conventional semiconductor device. For this reason, the created layer of PE silicon nitride must be adequately thick so that sufficient protection is provided to underlying operational semiconductor device features and interfaces.

U.S. Pat. No. 6,136,688 (Lin et al.) shows a process to reduce SiN cracking.

U.S. Pat. No. 5,419,787 (Levi) shows a stress reduced insulator.

U.S. Pat. No. 5,665,632 (Lur et al.), U.S. Pat. No. 5,517,062 (Lur et al.), U.S. Pat. No. 5,716,888 (Lur et al.) and U.S. Pat. No. 4,824,697 (Ishihara) are related patents.

SUMMARY OF THE INVENTION

A principle objective of the invention is to provide a method for the creation of a relatively thick layer of PE silicon nitride that is highly stress resistant.

Another objective of the invention is to provide a method of creating a layer of PE silicon nitride that does not have problems of layer cracking after the layer of PE silicon nitride has been created.

In accordance with the objectives of the invention a new method of creating a relatively thick layer of PE silicon nitride. A conventional method of creating a layer of silicon nitride applies a one-step process for the creation thereof. Film stress increases as the thickness of the created layer of PE silicon nitride increases. A new method is provided for the creation of a crack-resistant layer of PE silicon nitride by providing a multi-step process. The main processing step comprises the creation of a relatively thick, compressive film of PE silicon nitride, over the surface of this relatively thick layer of PE silicon nitride is created a relatively thin (between about 150 and 500 Angstrom) layer of tensile stress PE silicon nitride. This process can be repeated to create a layer of PE silicon nitride of increasing thickness. A layer of PE silicon nitride can in this manner be created to a thickness of about 4 μm, whereby this thick layer of PE silicon nitride is free of stress and therefor free of therefrom following cracking of the layer of PE silicon nitride.

BRIEF DESCRIPTION OF THE DRAWINGS

FIG. 1 is a cross section of a conventional method of creating a layer if silicon nitride.

FIG. 2 is a cross section of the a semiconductor surface, such as the surface of a silicon substrate, over the surface of which has been deposited one relatively thick first layer comprising a compressive layer of PE silicon nitride, a relatively thin second layer comprising a tensile stress layer of PE silicon has been deposited over the surface of the first layer.

FIG. 3 shows a cross section whereby the process highlighted in the cross section of FIG. 2 is repeated once.

FIG. 4 shows a cross section whereby the process highlighted in the cross section of FIG. 2 is repeated twice.

DESCRIPTION OF THE PREFERRED EMBODIMENTS

Figure 5:
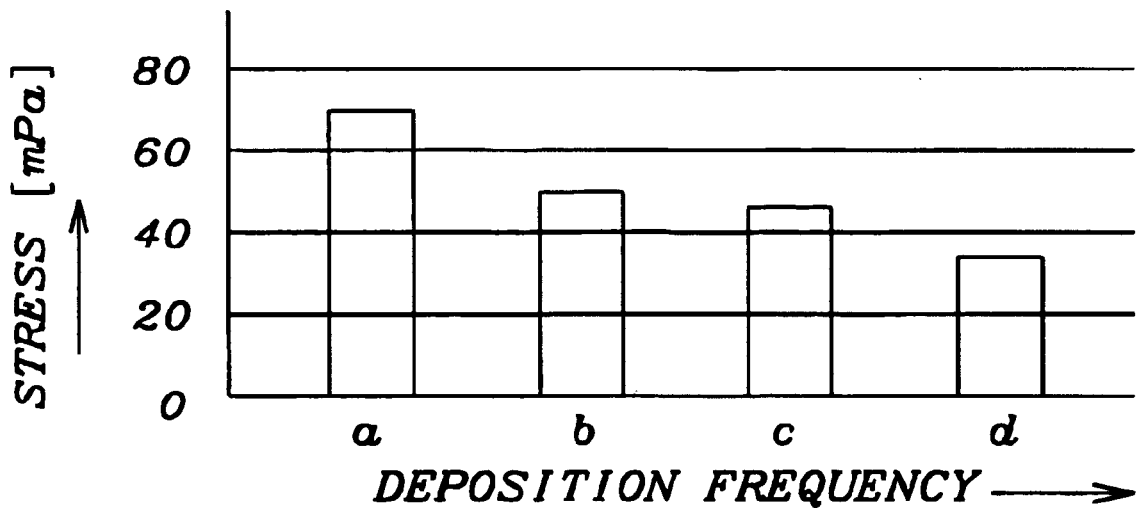
FIG. 5 presents a graphic display of stress versus deposition frequency, the deposition frequency being a conventional deposition, a one time, a two time and a three time deposition of a sequence of depositing a thick compression film over the surface of which is deposited a thin tensile stress film.

Layers of passivation that are created using PE silicon nitride for this purpose are characterized by the desirable characteristics of having good resistance to penetration of foreign matter such as moisture and alkali metal while in addition such a layer provides good protection against mechanical surface damage inflicted by for instance scratching of the exposed surface.

As a disadvantage of using such a layer of PE silicon nitride as a layer of passivation must be cited that increasingly thicker layers of PE silicon nitride exhibit increasing internal stress and are therefore increasingly prone to stress induced effects such as cracking of the surface or strata within the layer of PE silicon nitride.

Yet, as has previously been pointed out, the industry has a need to create a relatively thick layer of PE silicon nitride, up to for instance a thickness of about 20,000 Angstrom, required for creating finger print detector devices, whereby the device is directly exposed to effects of human contact and the therewith introduced effects of exposure to moisture and alkali metal.

As pointed out, increasing the thickness of a created layer of PE silicon nitride increases internal stress in the created layer of PE silicon nitride. In addition, by depositing a relatively thick layer of PE silicon nitride over the (large) surface of a semiconductor substrate, this relatively thick layer of PE silicon nitride introduces stress across the surface of the substrate and therewith causes a loss of planarity of the surface of the substrate, which makes the substrate prone to bending. This bending of the surface of the substrate further contributes to cracking of the deposited layer of PE silicon nitride.

Relative to the process of creating a layer of PE silicon nitride, the following comments are in order. A plasma nitridation is performed to form nitride of oxynitride, the source of nitrogen for the plasma may be a nitrogen containing precursor gas such as $N_2$ or $NH_3$ or their mixture with any other inert gas or an oxidizing gas such as No, $N_2O$ or $O_2$, the plasma is preferably a high-density plasma. The plasma may be generated by any number of sources, for example the following sources may be used: helicon, helical-resonator, electron-cyclotron resonance or inductively coupled. The substrate can be unbiased, in which case the ionized substances are accelerated by the plasma potential (in the order of 20 volts) and then implanted into the substrate surface. A bias can be applied to the substrate to further accelerate the ions from the plasma and implant the ions deeper into the surface of the substrate. Either a DC or a RF bias may be applied to the substrate. As an example the following process conditions may be used: plasma density between about 1E10 and 1E12 atoms/cm$^3$, nitrogen flow between about 1 and 2,000 sccm, pressure in the order of 1 to 300 mTorr, temperature in the range of 50 and 500 degrees C., substrate bias in the range of 0 to 200 Volts and a duration between about 1 and 300 seconds.

The preferred materials used by the invention for the creation of a layer of PE silicon nitride comprise monosilane ($SiH_4$) and ammonia ($NH_3$), the $SiH_4$ gas may be selected from the group consisting of Ar—, He—, $H_2$—and $N_2$—diluted $SiH_4$ gas. The layer of PE silicon nitride may for instance be deposited using PECVD procedures at a pressure between about 200 mTorr and 2,000 mTorr, at a temperature between about 350 and 450 degrees C., using the $NH_3$ and $SiH_4$ as source material.

Referring now to FIG. 1, there is shown a cross section of the conventional creation of a layer of passivation comprising PE silicon nitride. Specifically highlighted in the cross section of FIG. 1 are the layer 10, which is typically and preferably the surface of a silicon substrate, a layer 12 which represents semiconductor devices that have been created over the surface of substrate 10 and a layer 14 of passivation comprising PE silicon nitride. Layer 14 of silicon nitride passivation is, using conventional processing steps, created during a one-step process of passivation deposition. Conventional methods of creating a layer of silicon nitride passivation for instance use PECVD technology at a temperature between about 350 and 450 degrees C. with a pressure of between about 2.0 and 2.8 Torr for the duration between about 8 and 12 seconds.

The invention provides for replacing the one-step process of creating layer 14, FIG. 1, of silicon nitride passivation with an at least two step process as shown in cross section in FIG. 2, where specifically are highlighted the layer 14, of conventional compressive silicon nitride, and layer 16, of tensile stress silicon nitride.

The tensile stress that is inherent in the thin layer 16 of silicon nitride significantly serves the purpose of balancing the stress that is present in the underlying layer 14 of relatively thick silicon nitride.

Passivation film quality has been evaluated by measuring the reflectance index of layer 14, singly deposited, and layers 14 and 16, deposited one layer 16 over the surface of one layer 14. In both cases of evaluation, the film reflectance index has been measured as a value between about 1.98 and 2.02, which indicates that the film quality has not been impaired by the deposition of tensile stress releasing film 16 over the surface of stress compressive film 14.

In addition, the Refractive Index (RI) of the respective layers of PE silicon nitride have been measured, having therewith confirmed that the RI for a conventionally created film of about 20,000 Angstrom thick and the RI of the at least two PE silicon nitride films using the method of the invention are essentially alike at a value of 2.0+/−0.05.

The first dual step the results of which have been shown in the cross section of FIG. 2 can now be repeated for the creation of a thicker layer of PE silicon nitride, created to a thickness of for instance between about 15,000 and 25,000 Angstrom but more preferably to a thickness of about 20,000 Angstrom. This repetition can be performed in a number of different manners, as follows:

Perform one conventional processing step, creating a film of PE silicon nitride about 20,000 Angstrom thick Perform, FIG. 3, a first processing step of creating a first layer 14 comprising compressive PE silicon nitride of 10,000 Angstrom thick, perform a second processing step of creating a second layer 16 comprising tensile stress PE silicon nitride of about 150 to 500 Angstrom thick over the surface of the first layer, perform a third processing step of creating a third layer 18 comprising compressive PE silicon nitride of 10,000 Angstrom thick over the surface of the second layer 16, perform a fourth processing step of creating a fourth layer 20 comprising tensile stress PE silicon nitride of about 150 to 500 Angstrom over the surface of the third layer 18; it will be noted that the ratio between the thickness of layer 14 and the thickness of layer 16 is between about 10,000/150 and 10,000/500 or between about 100 and 20.

Perform, FIG. 4, a first processing step of creating a first layer 22 comprising compressive PE silicon nitride of 6,500 Angstrom thick, perform a second processing step of creating a second layer 24 comprising tensile stress PE silicon nitride of about 150 to 500 Angstrom thick over the surface of the first layer 22, perform a third processing step of creating a third layer 26 comprising compressive PE silicon nitride of 6,500 Angstrom thick over the surface of the second layer 24, perform a fourth processing step of creating a fourth layer 28 comprising tensile stress PE silicon nitride of about 150 to 500 Angstrom over the surface of the third layer 26, perform a fifth processing step of creating a fifth layer 30 comprising compressive PE silicon nitride of 6,500 Angstrom thick over the surface of the fourth layer 28, perform a sixth processing step of creating a sixth layer 32 comprising tensile stress PE silicon nitride of about 150 to 500 Angstrom over the surface of the fifth layer 30, and Repeating the above sequence (not shown) thereby however reducing the thickness of the deposited layers of compressive PE silicon nitride to 5,000 Angstrom, continuing the process up to the point where a layer with a combined or total thickness of 20,000 Angstrom has been created, this latter layer comprising four layers of compressive PE silicon nitride of 5,000 Angstrom thick in addition to comprising four layers of tensile stress PE silicon nitride of about 150 to 500 Angstrom thick.

Four all of the cases and sequences of deposition, the quality of the created layer of PE silicon nitride having a thickness of between about 15,0000 and 25,000 Angstrom but more preferably of about 20,000 Angstrom has been evaluated by evaluating the film stress of the created, 20,000 thick layer of PE silicon nitride. For the conventional method of creating a 20,000 Angstrom thick layer of PE silicon nitride, a film stress of 90 mPa has been measured, for all of the composite methods of creating a layer of PE silicon nitride with a combined thickness of about 20,0000 Angstrom, a film stress of about 40 mPa has been measured, confirming that the invention has provided a significant reduction of the stress that is induced in a thick layer of PE silicon nitride.

The latter measured performance is graphically shown in FIG. 5, where specifically are highlighted:
along the horizontal or X-axis the deposition method is represented
along the vertical or Y-axis the measured film stress for each deposition method is represented
case "a" is the film stress measured for the conventional method of creating a 20,000 Angstrom thick film of PE silicon nitride, this film stress is about 70 mPa
case "b" is the film stress measured for the above highlighted two-step method of creating a 20,000 Angstrom thick film of PE silicon nitride, this film stress is about 48 mPa
case "c" is the film stress measured for the above highlighted three-step method of creating a 20,000 Angstrom thick film of PE silicon nitride, this film stress is about 46 mPa, and
case "d" is the film stress measured for the above highlighted four-step method of creating a 20,000 Angstrom thick film of PE silicon nitride, this film stress is about 38 mPa.

The following points that relate to the deposition of the various layers are critically important to the invention:
1. The relatively thick layers of silicon nitride, such as layer 14 in FIG. 2, layers 14 and 18 in FIG. 3 and layers 22, 26 and 30 in FIG. 4, function as compressive layers of semiconductor material
2. The relatively thin layers of silicon nitride, such as layer 16 in FIG. 2, layers 16 and 20 in FIG. 3 and layers 24, 28 and 32 in FIG. 4, function as tensile stress layers of semiconductor material
3. Of key significance is the ratio of the thickness between the relatively thick layers of silicon nitride and the relatively thin layers of silicon nitride. For instance the ratio between the thickness of layer 14 in FIG. 3 and the thickness of layer 16 of FIG. 3; this ratio, for the layers 14 and 12 shown in FIG. 3, is about 10,000/150–500 or between about 216 and 20; this ratio is preferably to be maintained when additional layers of thick (compressive) and thin (tensile) layers ore deposited whereby the total stack thickness is to be about 20,000 Angstrom.

Processing conditions for the creation of a compressive, relatively thick layer of PE silicon nitride and for the creation of a tensile stress, relatively thin layer of PE silicon nitride differ, as follows:
1. For the creation of the compressive, relatively thick layer of PE silicon nitride, a RF power of about 870 Watt is applied, $SiH_4$ is supplied at a flow rate of about 630 sccm, $NH_3$ is supplied at a flow rate of about 2,600 sccm, and
2. For the creation of the tensile stress, relatively thin layer of PE silicon nitride, a RF power of about 450 Watt is applied, $SiH_4$ is supplied at a flow rate of about 250 sccm, $NH_3$ is supplied at a flow rate of about 2,600 sccm.

Figure 6:
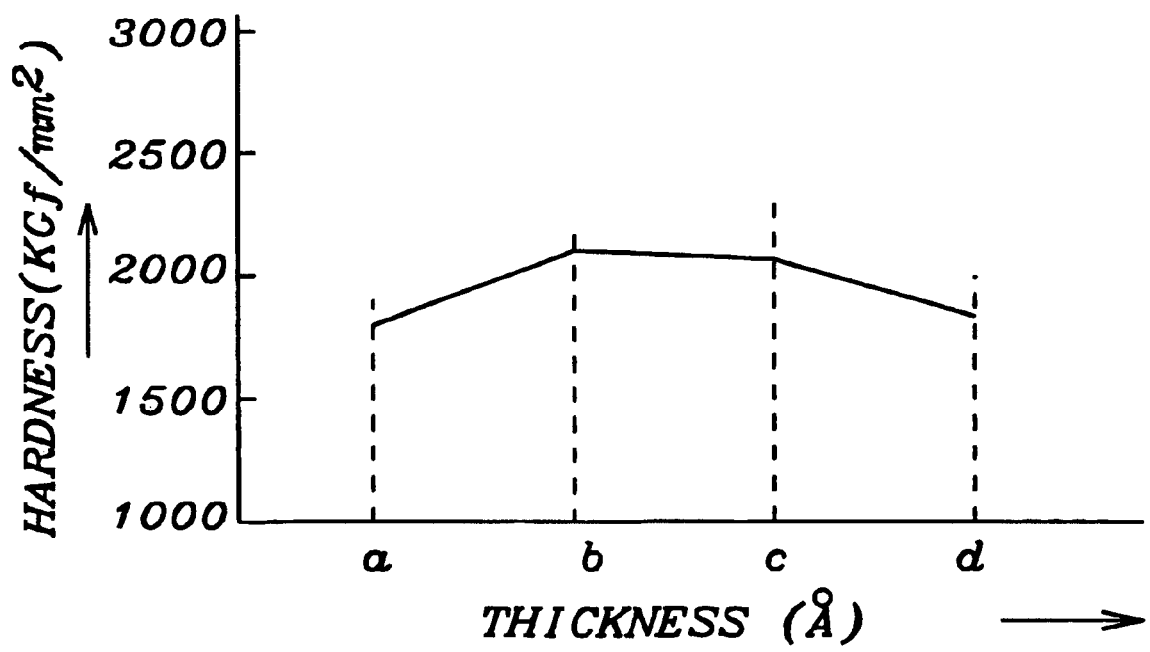
FIG. 6 shows a graphic display of surface hardness as a function of the thickness of a created layer of PE silicon nitride.

Further has been evaluated surface hardness of the various layers of PE silicon nitride, the results of which have been shown in the graph of FIG. 6.

The latter measured performance is graphically shown in FIG. 6, where specifically are highlighted:
along the horizontal or X-axis the deposition method is represented
along the vertical or Y-axis the measured hardness of the created film of PE silicon nitride is represented
case "a" is the surface hardness measured for the conventional method of creating a 30,000 Angstrom thick film of PE silicon nitride, this hardness is about 1,800 $KGf/mm^2$
case "b" is the film stress measured for the above highlighted two-step method of creating a 15,000 Angstrom thick film of PE silicon nitride during each of the two steps for a combined layer thickness of 30,000 Angstrom, hardness is about 2,150 $KGf/mm^2$
case "c" is the film stress measured for the above highlighted three-step method of creating a 10,000 Angstrom thick film of PE silicon nitride, for a combined layer thickness of 30,000 Angstrom, hardness is about 2,100 $KGf/mm^2$, and
case "d" is the film stress measured for the above highlighted four-step method of creating a 7,500 Angstrom thick film of PE silicon nitride, for a combined layer thickness of 30,000 Angstrom, hardness is about 1,800 $KGf/mm^2$.

Ideally, surface hardness of a created film of PE silicon nitride equals about 1,700 $KGf/mm^2$ from which can be concluded that the invention, by adding the tensile stress layers of between about 150 and 500 Angstrom thick, does not negatively affect required surface hardness characteristics.

From the above the following summary statements relating to the invention can be derived:
1. The conventional method of creating a layer of PE silicon nitride is divided by the invention into a multi-step process that may comprise two, three, four or more steps whereby the combined layer that is created by these multiple steps has a required thickness that significantly exceeds conventional deposition thickness of a deposited layer of PE silicon nitride
2. The method of using multiple steps for the creation of a layer of PE silicon nitride results in a layer of PE silicon nitride that has low compressive stress and high crack resistance 3. Hardness tests of the created, composite layer of PE silicon nitride indicate that hardness has not been negatively affected by the multi deposition procedure of the invention 4. The steps of multi-deposition for the creation of a layer of PE silicon nitride has been observed as not introducing problems of loose residue as a result thereof, specifically metal residue occurring during or after the creation of openings through the thicker layer of PE silicon nitride for the creation of for instance openings there-through that are aligned with bond pads, and 5. Experimental results and considerations of cost performance make the two-step deposition method the preferred method of creating a layer of PE silicon nitride, the specific processing conditions and the difference between these processing conditions for the two step method have been indicated above; in the two step process, the deposition of the silicon nitride is a continuous process whereby however conditions of applied RF power and source gas flow are adjusted in order to create an optimal sequence of thick layer followed by a thin layer of PE silicon nitride.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. The method of creating a layer of silicon nitride, comprising the steps of:

providing a semiconductor substrate;

depositing a first layer of compressive silicon nitride having a first thickness over the substrate; and depositing a second layer of tensile stress silicon nitride having a second thickness, wherein said second thickness is smaller than said first thickness by an amount and relates to said first thickness by a ratio or factor.

2. The method of claim 1, said depositing a first layer of silicon nitride comprising methods of Plasma Enhanced silicon nitride deposition.

3. The method of claim 1, said depositing a second layer of silicon nitride comprising methods of Plasma Enhanced silicon nitride deposition.

4. The method of claim 1, said first thickness being between about 15,000 and 25,000 Angstrom.

5. The method of claim 1, said second thickness being between about 150 to 500 Angstrom.

6. The method of claim 1, said first depositing comprising applying a RF power of about 870 Watt, using $SiH_4$ as a first source gas supplied at a flow rate of about 630 sccm, using $NH_3$ as a second source gas supplied at a flow rate of about 2,600 sccm.

7. The method of claim 1, said second depositing comprising applying a RF power of about 450 Watt, using $SiH_4$ as a first source gas supplied at a flow rate of about 250 sccm, using $NH_3$ as a second source gas supplied at a flow rate of about 2,600 sccm.

8. The method of claim 1, said first depositing a first layer of silicon nitride and said second depositing a second layer of silicon nitride comprising a continuous processing sequence performed in one processing chamber.

9. The method of claim 1, said ratio or factor having a value between about 216 and 20.

10. A method of creating a layer of silicon nitride, comprising the steps of:

providing a semiconductor substrate;

depositing a first layer of silicon nitride having a first thickness over the substrate; and depositing a second layer of silicon nitride having a second thickness, whereby said second thickness is smaller than said first thickness by an amount, said second thickness added to said first thickness having a value between about 15,000 and 25,000 Angstrom, said first thickness relating to said second thickness by a predetermined ratio.

11. The method of claim 10, said depositing a first layer of silicon nitride comprising methods of Plasma Enhanced silicon nitride deposition.

12. The method of claim 10, said depositing a second layer of silicon nitride comprising methods of Plasma Enhanced silicon nitride deposition.

13. The method of claim 10, said first thickness being between about 15,000 and 25,000 Angstrom.

14. The method of claim 10, said second thickness being between about 150 to 500 Angstrom.

15. The method of claim 10, said depositing a first layer of silicon nitride comprising applying a RF power of about 870 Watt, using $SiH_4$ as a first source gas supplied at a flow rate of about 630 sccm, using $NH_3$ as a second source gas supplied at a flow rate of about 2,600 sccm.

16. The method of claim 10, said depositing a second layer of silicon nitride comprising applying a RF power of about 450 Watt, using $SiH_4$ as a first source gas supplied at a flow rate of about 250 sccm, using $NH_3$ as a second source gas supplied at a flow rate of about 2,600 sccm.

17. The method of claim 10, said depositing a first layer of silicon nitride and said depositing a second layer of silicon nitride comprising a continuous processing sequence performed in one processing chamber.

18. A method of creating a layer of silicon nitride, comprising the steps of:

providing a semiconductor substrate;

depositing over said semiconductor substrate at least one stack of layers of silicon nitride by depositing a first layer of compressive PE silicon nitride having a first thickness, further by depositing a second layer of tensile PE silicon nitride having a second thickness, whereby said second thickness is smaller than said first thickness by an amount and relates to said first thickness by a factor or ratio.

19. The method of claim 18, said first thickness being between about 15,000 and 25,000 Angstrom.

20. The method of claim 18, said second thickness being between about 150 to 500 Angstrom.

21. The method of claim 18, said depositing a first layer of compressive PE silicon nitride comprising applying a RF power of about 870 Watt, using $SiH_4$ as a first source gas supplied at a flow rate of about 630 sccm, using $NH_3$ as a second source gas supplied at a flow rate of about 2,600 sccm.

22. The method of claim 18, said depositing a second layer of tensile PE silicon nitride comprising applying a RF power of about 450 Watt, using $SiH_4$ as a first source gas supplied at a flow rate of about 250 sccm, using $NH_3$ as a second source gas supplied at a flow rate of about 2,600 sccm.

23. The method of claim 18, said depositing a first layer of compressive PE silicon nitride having a first thickness and said second depositing a second layer of tensile stress PE silicon nitride comprising a continuous processing sequence performed in one processing chamber.

24. A layer of silicon nitride created over a substrate, comprising:

a semiconductor substrate;

a first layer of compressive silicon nitride having a first thickness deposited over the substrate; and a second layer of tensile stress silicon nitride having a second thickness deposited over the first layer of compressive silicon nitride, wherein said second thickness is smaller than said first thickness by an amount and relates to said first thickness by a ratio or factor.

25. The layer of silicon nitride of claim 24, said first thickness being between about 15,000 and 25,000 Angstrom.

26. The layer of silicon nitride of claim 24, said second thickness being between about 150 to 500 Angstrom.

27. The layer of silicon nitride of claim 24, said ratio or factor having a value between about 216 and 20.

28. A layer of silicon nitride created over a substrate, comprising:

a semiconductor substrate;

a first layer of compressive silicon nitride having a first thickness deposited over the substrate; and a second layer of tensile stress silicon nitride having a second thickness deposited over the first layer of silicon nitride, whereby said second thickness is smaller than said first thickness by an amount, said second thickness added to said first thickness having a value between about 15,000 and 25,000 Angstrom, said first thickness relating to said second thickness by a predetermined ratio.

29. The layer of silicon nitride of claim 28, said first thickness being between about 15,000 and 25,000 Angstrom.

30. The layer of silicon nitride of claim 28, said second thickness being between about 150 to 500 Angstrom.

31. A layer of silicon nitride created over a substrate, comprising:

a semiconductor substrate;

at least one stack of layers of silicon nitride deposited over the substrate comprising a first layer of compressive PE silicon nitride having a first thickness, further comprising a second layer of tensile PE silicon nitride having a second thickness, whereby said second thickness is smaller than said first thickness by an amount and relates to said first thickness by a factor or ratio.

32. The layer of silicon nitride of claim 31, said first thickness being between about 15,000 and 25,000 Angstrom.

33. The layer of silicon nitride of claim 31, said second thickness being between about 150 to 500 Angstrom.

34. An Integrated Circuit device over which a layer of silicon nitride is created, comprising:

a semiconductor substrate, at least one integrated circuit device having been created in or over the substrate;

a first layer of compressive silicon nitride having a first thickness deposited over the at least one integrated circuit device; and a second layer of tensile stress silicon nitride having a second thickness deposited over the first layer of compressive silicon nitride, wherein said second thickness is smaller than said first thickness by an amount and relates to said first thickness by a ratio or factor.

35. The layer of silicon nitride of claim 34, said first thickness being between about 15,000 and 25,000 Angstrom.

36. The layer of silicon nitride of claim 34, said second thickness being between about 150 to 500 Angstrom.

37. The layer of silicon nitride of claim 34, said ratio or factor having a value between about 216 and 20.

38. An Integrated Circuit device over which a layer of silicon nitride is created, comprising:

a semiconductor substrate, at least one integrated circuit device having been created in or over the substrate;

a first layer of compressive silicon nitride having a first thickness deposited over the at least one integrated circuit device; and a second layer of tensile stress silicon nitride having a second thickness deposited over the first layer of silicon nitride, whereby said second thickness is smaller than said first thickness by an amount, said second thickness added to said first thickness having a value between about 15,000 and 25,000 Angstrom, said first thickness relating to said second thickness by a predetermined ratio.

39. The layer of silicon nitride of claim 38, said first thickness being between about 15,000 and 25,000 Angstrom.

40. The layer of silicon nitride of claim 38, said second thickness being between about 150 to 500 Angstrom.

41. An Integrated Circuit device over which a layer of silicon nitride is created, comprising:

a semiconductor substrate, at least one integrated circuit device having been created in or over said substrate;

at least one stack of layers of silicon nitride deposited over the at least one integrated circuit device, said at least one stack of silicon nitride layers comprising a first layer of compressive PE silicon nitride having a first thickness, further comprising a second layer of tensile PE silicon nitride having a second thickness, whereby said second thickness is smaller than said first thickness by an amount and relates to said first thickness by a factor or ratio.

42. The layer of silicon nitride of claim 41, said first thickness being between about 15,000 and 25,000 Angstrom.

43. The layer of silicon nitride of claim 41, said second thickness being between about 150 to 500 Angstrom.

* * * * *